United States Patent [19]

de Jager et al.

[11] Patent Number: 5,113,146

[45] Date of Patent: May 12, 1992

[54] AMPLIFIER ARRANGEMENT

[75] Inventors: Willem de Jager; Eetze A. de Boer, both of Enschede, Netherlands

[73] Assignee: U.S. Philips Corp., New York, N.Y.

[21] Appl. No.: 667,845

[22] Filed: Mar. 12, 1991

[30] Foreign Application Priority Data

Mar. 21, 1990 [NL] Netherlands .......................... 9000656

[51] Int. Cl.⁵ .............................................. H03F 3/45
[52] U.S. Cl. .................................. 330/252; 330/257; 330/259; 307/494
[58] Field of Search ............... 330/252, 257, 261, 260, 330/69, 259; 307/494

[56] References Cited

U.S. PATENT DOCUMENTS

| Re. 29,700 | 7/1978 | van de Plassche | 330/253 |
|---|---|---|---|
| 4,223,276 | 9/1980 | Nagano | 330/257 |
| 4,258,331 | 3/1981 | Nakayama | 330/257 |
| 4,338,527 | 7/1982 | Nagano | 330/257 |

Primary Examiner—Eugene R. LaRoche
Assistant Examiner—Tan Dinh
Attorney, Agent, or Firm—Steven R. Biren

[57] ABSTRACT

An amplifier arrangement includes a transistor differential pair (N1, N2) having an input terminal (3) and an output terminal (4). The transistor differential pair is coupled to a current mirror (P1, P2). A first level shifting circuit (6) and a second level shifting circuit (7) stabilize the d.c. voltage levels on the mutually coupled main electrodes of the differential pair (N1, N2) and the current mirror (P1, P2) respectively. Consequently, the influence of the Early-effect on the differential pair is suppressed and an improved linear signal transmission is obtained from the input terminal (3) to the output terminal (4). The level shifting circuit (6) also provides a base current compensation in order to produce a high input impedance and the second level shifting circuit (7) provides a base current compensation for equal adjusting currents through the differential pair to reduce any offset voltage.

12 Claims, 1 Drawing Sheet

AMPLIFIER ARRANGEMENT

BACKGROUND OF THE INVENTION

This invention relates to an amplifier arrangement being provided with a differential pair comprising at least a first and a second transistor of a first conductivity type and with a first main electrode of the first transistor and a first main electrode of the second transistor mutually coupled and coupled to a first supply terminal by means of a current source. A control electrode of the first transistor being coupled to an input terminal and a control electrode of the second transistor is coupled to an output terminal. A current mirror included which comprises at least a third and a fourth transistor of a second conductivity type. A first main electrode of the third transistor and a first main electrode of the fourth transistor are mutually coupled and coupled to a second supply terminal by means of a common terminal. A second main electrode of the third transistor is coupled to a second main electrode of the first transistor and a second main electrode of the fourth transistor is coupled to a second main electrode of the second transistor. A buffer stage comprises at least a fifth transistor of the first conductivity type with a control electrode of the fifth transistor with coupled to the second main electrode of the second transistor, a first main electrode of the fifth transistor with coupled to the output terminal and a second main electrode of the fifth transistor with coupled to the second supply terminal.

Such an amplifier arrangement can be widely used and, more specifically, as a voltage-to-current converter in integrated semiconductor circuits.

An amplifier arrangement of the described type is known from U.S. Pat. 4,338,527.

In this known amplifier arrangement the input terminal is connected to a grounded voltage source and the first and second supply terminals are connected to a negative and a positive supply voltage, respectively. Furthermore, the mutually coupled control electrodes of the third and fourth transistors are connected to the mutually coupled second main electrodes of the first and third transistors so that the second main electrode of the first transistor is adjusted to a voltage equal to the positive supply voltage minus the voltage between the second main electrode and the control electrode of the third transistor. The second main electrode of the second transistor, however, disregarding the offset voltage between the input terminal and the output terminal, is adjusted to a voltage equal to the voltage on the input terminal augmented by the voltage between the second main electrode and the control electrode of the fifth transistor. A disadvantage of this known amplifier arrangement is that with an arbitrary choice of the two supply voltages there is a voltage difference between the respective voltages on the second main electrodes of the first and second transistors. As a result the differential pair is adjusted asymmetrically and, consequently, an undesired non-linear signal transmission from the input terminal to the output terminal takes place. In addition, this disadvantage is enhanced because the voltage on the second main electrode of the first transistor varies with variations of the positive supply voltage, whereas the voltage on the second main electrode of the second transistor does not substantially vary in that case.

SUMMARY OF THE INVENTION

It is an object of the invention to provide an amplifier arrangement with improved linear signal transmission.

An amplifier arrangement according to the invention is characterised in that the control electrode of the first transistor is coupled to the common terminal by means of a first level shifting circuit. By means of the level shifting circuit thus coupled, a fixed voltage-difference is applied between the common terminal and the control electrode of the first transistor so that a coupling is achieved between the voltages on the second main electrodes of the first and second transistors. Consequently, the voltage difference between the respective voltages can be adjusted to zero volts and thus an improved linear signal transmission is obtained.

An amplifier arrangement according to the invention can furthermore be characterised in that the control electrode of the fifth transistor is coupled to the second main electrode of the second transistor by means of a second level shifting circuit. By means of the second level shifting circuit thus coupled, an adjustable voltage is applied between the control electrode of the fifth transistor and the second main electrode of the second transistor so that the voltage between the second main electrode and the control electrode of the second transistor is adjustable. This is advantageous in that the influence of the Early-effect on both the second and first transistors can be reduced. The Early-effect relates to variations of the gain factor of a transistor due to variations of its second main electrode—control electrode voltage. By means of the level shifting circuits inserted according to the invention the second main electrode—control electrode voltages of both the second and first transistors can be adjusted to zero volts, at which voltage the influence of the Early-effect is practically zero.

An embodiment of an amplifier arrangement according to the invention can be characterised in that the first level shifting circuit comprises a transistor of the second conductivity type and a current source, a first main electrode of the transistor of the first level shifting circuit being coupled to both the second supply terminal by means of the current source of the first level shifting circuit and to the common terminal, a second main electrode of the transistor of the first level shifting circuit being coupled to the first supply terminal and a control electrode of the transistor of the first level shifting circuit being coupled to the control electrode of the first transistor. In this embodiment the second main electrode and the control electrode of the first transistor are coupled by means of two serially opposed control electrode—main electrode junctions, so that the voltage between these electrodes is adjusted to practically zero volts. In addition, by virtue of the current source thus coupled the various voltages in the amplifier arrangement are no longer related to the voltage coupled to the second supply terminal so that larger output signals can be tapped from the output terminal. Moreover, in this embodiment the control electrode currents of the first and the additional transistors are oppositely oriented. This is advantageous in that the control electrode currents of these transistors compensate each other if properly dimensioned so that the amplifier arrangement, in a state of rest does not cause any current to flow through the input terminal and, consequently, has a high input impedance.

A further embodiment of an amplifier arrangement according to the invention may be characterised in that the second level shifting circuit comprises a transistor of the second conductivity type and a current source, a first main electrode of the transistor of the second level shifting circuit being coupled to both the second supply terminal by means of the current source of the second level shifting circuit and to the control electrode of the fifth transistor, a second main electrode of the transistor of the second level shifting circuit being coupled to the first supply terminal and a control electrode of the transistor of the second level shifting circuit being coupled to the second main electrode of the second transistor. In this embodiment the second main electrode and the control electrode of the second transistor are coupled by means of two serially opposed control electrode - main electrode junctions, so that the voltage between these electrodes also is adjusted to practically zero volts. Since the additional transistor further applies a control electrode current to the second main electrode of the second transistor, in this further embodiment the offset voltage is likewise reduced due to unequal adjusting currents through the first and second transistors, if the control electrodes of the third and fourth transistors are coupled to the second main electrode of the third transistor.

A still further embodiment of an amplifier arrangement according to the invention may be characterised in that the current source connected to the differential pair and the current source belonging to the second level shifting circuit are arranged to produce substantially equal currents. With a current mirror comprising only the third and fourth transistors, this embodiment is advantageous in that the control electrode current of the fourth transistor is equal to the sum of the control electrode currents of the third and fourth transistors because the current-source currents are equal. Consequently, in addition to equal second main electrode currents of the third and fourth transistors, also equal control electrode currents are applied to the second main electrodes of the first and second transistors, so that the aforementioned offset voltage is practically zero.

BRIEF DESCRIPTION OF THE DRAWING

The invention will be further explained with reference to the appended drawing, in which.

In these Figures like components are denoted by like reference characters.

DESCRIPTION OF THE PREFERRED EMBODIMENTS

Figure 1:
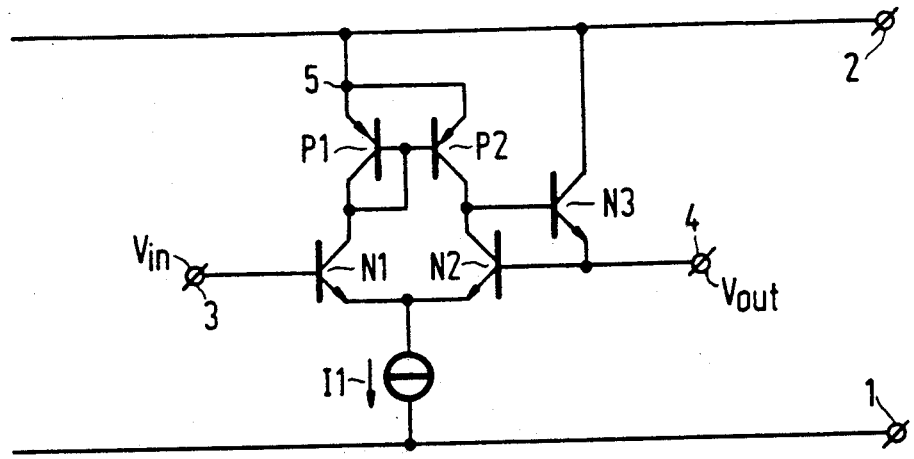
FIG. 1 shows an amplifier arrangement according to the state of the art.

The prior-art amplifier arrangement represented in FIG. 1 shows a differential pair composed of a first transistor N1 and a second transistor N2, whose mutually coupled emitters are coupled to a first supply terminal 1 by means of a current source I1. The bases of the transistors N1 and N2 are coupled, respectively, to an input terminal 3 for supplying an input signal Vin and to an output terminal 4 for tapping an output signal Vout. The collectors of the transistors N1 and N2 are coupled to respective input and output terminals of a current mirror circuit, which terminals are constituted by the collectors of a third transistor P1 and a fourth transistor P2, respectively. The emitters of the third and fourth transistors are coupled to a second supply terminal 2 by means of a common terminal 5. The bases of the transistors P1 and P2, are mutually coupled and are also coupled to the collector of transistor P1, whereas the collector of transistor P2 is coupled to the base of a fifth transistor N3. This transistor N3 constitutes a buffer stage in which its collector is coupled to the supply terminal 2 and its emitter to the output terminal 4. The input signal Vin produces complementary current changes in the transistors N1 and N2 with the transistors P1 and P2 of the current mirror following the current changes in the transistor N1. Consequently, the base of the transistor N3 receives a differential current which is the difference between the collector currents of the transistors N2 and P2, which differential current is amplified by the transistor N3. The amplified differential current results in the output signal Vout.

However, the prior-art amplifier arrangement has an undesired non-linear signal transmission as a result of unequal voltages on the collectors of the transistors N1 and N2, which voltages are determined by the control voltage connected to the supply terminal 2 and the adjusted voltage of the input terminal 3 respectively. The non-linear signal transmission is also amplified because the collector voltage of the transistor N1 varies when said supply voltage varies. Resultant voltages between the collector and the base of both transistor N1 and transistor N2 in the prior-art amplifier arrangement circuit bring about the disadvantage of the Early-effect. An additional disadvantage of this amplifier arrangement is its offset voltage between the input terminal 3 and the output terminal 4. Because the base-emitter voltages of the transistors P1 and P2 are equal, these transistors carry equal collector currents. The collector current of transistor P1 together with the base currents of the transistors P1 and P2 is applied to the collector of transistor N1, whereas the collector current of transistor P2 minus the base current of transistor N3 is applied to the collector of transistor N2. Consequently, the transistors N1 and N2 carry both unequal collector currents and unequal emitter currents of which the latter cause unequal base-emitter voltages. Since the emitters of the transistors N1 and N2 are mutually coupled, these unequal base-emitter voltages result in the undesired offset voltage.

A further disadvantage of the prior-art amplifier arrangement is its relatively low input impedance which is especially undesired if the amplifier arrangement is used as a voltage-current conversion circuit.

Figure 2:
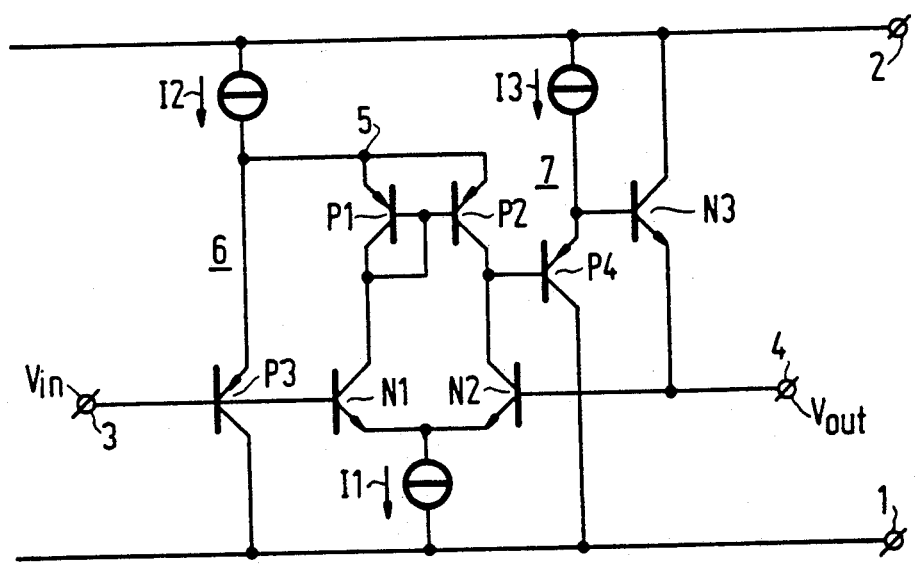
FIG. 2 shows an embodiment of an amplifier arrangement according to the invention.

FIG. 2 shows an embodiment of an amplifier arrangement according to the invention in which a first level shifting circuit 6 and a second level shifting circuit 7 are additionally inserted in the amplifier arrangement shown in FIG. 1. The level shifting circuit 6 comprises a transistor P3 as well as a current source I2 and is coupled between the base of the transistor N1 and the common terminal 5. In this arrangement the base of transistor P3 is coupled to the base of transistor N1 and the emitter of transistor P3 is coupled to the common terminal 5. This terminal 5 is also coupled to the supply terminal 2 via the current source I2. The collector of the transistor P3 is coupled to the supply terminal 1. The level shifting circuit 7 comprises a transistor P4 as well as a current source I3 and is inserted between the mutually coupled collectors of the transistors N2 and P2 and the base of transistor N3. In this arrangement the base of transistor P4 is coupled to the mutually coupled collectors of the transistors N2 and P2 and the emitter of transistor P4 to the base of transistor N3, which base is also coupled to the supply terminal 2 by means of the current source I3. The collector of the transistor P4 is connected to the supply terminal 1. The level shifting circuits 6 and 7 thus arranged cause mutually equal voltages to occur on the collectors of the transistors N1 and N2. In addition, contrary to the corresponding voltages in FIG. 1, the voltages are not related to the supply voltage but to the adjusted voltage on the input terminal. Because the base and the collector of transistor N1 are coupled by means of the serially opposed base-emitter junctions of the transistors P3 and P1, there will be a voltage between the base and the collector of transistor N1 which is practically zero volts, with an attendant reduced influence of the Early-effect on the transistor N1. Furthermore, the current source I2 thus coupled causes a reduced influence of variations of the supply voltage on the base-collector voltage of the transistor N1. In order to obtain a likewise reduced influence of the Early-effect on the transistor N2, the base and the collector of transistor N2 are coupled by means of the serially opposed base-emitter junctions of the transistors N3 and P4, so that a voltage of practically zero volts also is adjusted between the base and collector of transistor N2. When adding to the arrangement of FIG. 1 the level shifting circuit 6 without adding the level shifting circuit 7, the level shifting circuit 6 is required to comprise a diode inserted between the emitters of the transistors P1 and P3. The base-collector voltage of transistor N1 is then made equal to the corresponding voltage of transistor N2 so that the Early-effect again has a reduced influence on transistors N1 and N2 with an attendant improved linearity of the signal transmission. An additional advantage of the use of the level shifting circuit 6 is the opposite orientation of the base currents of the transistors N1 and P3. When properly choosing the adjusting currents through these transistors, the base current of transistor N1 in an absolute sense is equal to the base current of transistor P3 so that in a state of rest no current flows through input terminal 3. This increases the input impedance. In addition, the level shifting circuit 7 applies the base current of transistor P4 to the collector of transistor N2, which base current is oriented similar to the base currents of the transistors P1 and P2 applied to the collector of transistor N1. This reduces the current inequality of the currents flowing through the transistors N1 and N2 caused by the current mirror circuit (P1, P2), which results in a reduction of the undesired offset voltage between the input and output terminals. If the currents of the current sources I1 and I3 are equal, a minimum offset voltage will be obtained because then the base current of transistor P3 will be equal to the sum of the base currents of the transistors P1 and P2.

Figure 3:
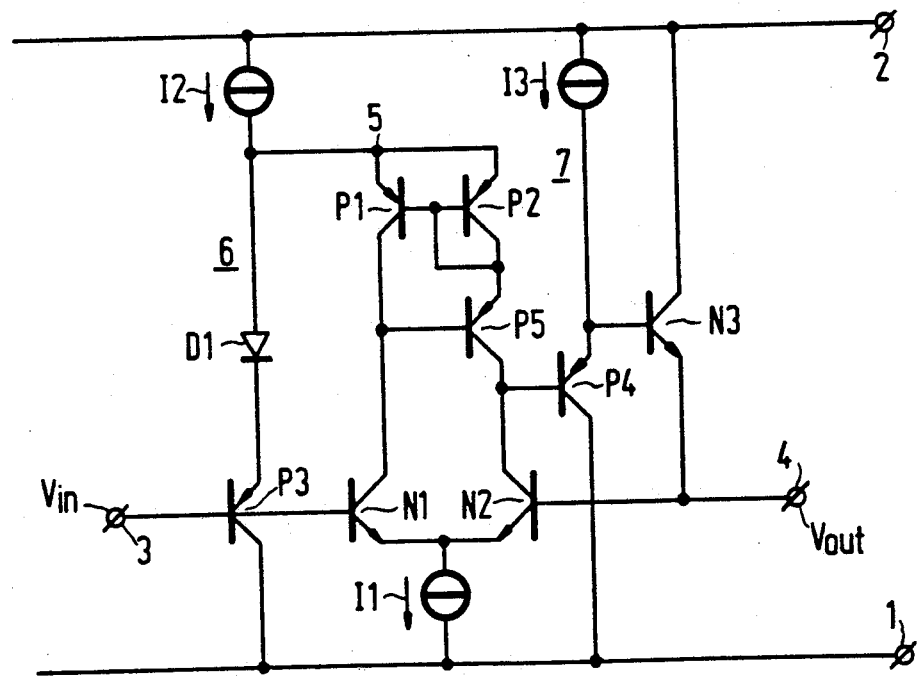
FIG. 3 shows a further embodiment of an amplifier arrangement according to the invention.

The further embodiment of an amplifier arrangement according to the invention represented in FIG. 3 differs from the embodiment represented in FIG. 2 in the manner in which the current mirror circuit and, consequently, the level shifting circuit 6 are arranged. To the current mirror circuit a transistor P5 of the second conductivity type is added, which is coupled via its emitter and collector respectively, to the collector of the transistor P2 and the base of transistor P4 and the collector of transistor N2. The base of transistor P5 is coupled to the collectors of the transistors N1 and P1, so that FIG. 3 further differs from FIG. 2 in that because the bases of the transistors P1 and P2 are coupled to the collector of the transistor P2. Furthermore, a diode D1 is added to level shifting circuit 6, which diode may be arranged, for example, as a diode-coupled transistor. The diode D1 is inserted between the emitter of the transistor P3 on the one hand and the common terminal 5 and the current source I2 on the other. This embodiment illustrates the manner in which a reduction of the influence of the Early-effect is obtained when a different type of current mirror circuit is used. The voltage between the base and the collector of transistor N1 is now adjusted to practically zero volts by coupling the base of transistor N1 to the collector of transistor N1 via the base-emitter junction of transistor P3, the anode-cathode junction of diode D1, the emitter-base junction of transistor P1 and the emitter-base junction of transistor P5. With respect to the base-collector voltage of transistor N2 nothing has changed compared to FIG. 2.

The invention is not restricted to the embodiments shown. Within the scope of the invention a number of variations may be contemplated by those skilled in the art. For example, the differential pair may be arranged in various ways, for example, by means of Darlington transistors. Also the current mirror circuit may be implemented in more ways than the one shown, in which circuit the influence of the Early-effect can always be reduced by adapting one or both level shifting circuits. Also a substitution of the buffer stage comprising the fifth transistor with another buffer stage comprising, for example, a Darlington transistor, is one of the options, whereas the object aimed at can be achieved by adapting one or both level shifting circuits. Furthermore, the amplifier arrangement according to the invention can be arranged to comprise transistors of a conductivity type opposite to the transistors shown in the Figures or also unipolar transistors or a combination of unipolar and bipolar transistors.

We claim:

1. An amplifier arrangement comprising: a differential pair including at least a first and a second transistor of a first conductivity type, means for mutually coupling a first main electrode of the first transistor and a first main electrode of the second transistor to a first supply terminal by means of a current source, a control electrode of the first transistor being coupled to an input terminal and a control electrode of the second transistor being coupled to an output terminal, a current mirror comprising at least a third and a fourth transistor of a second conductivity type with a first main electrode of the third transistor and a first main electrode of the fourth transistor mutually coupled to a second supply terminal by means of a common terminal, a second main electrode of the third transistor being coupled to a second main electrode of the first transistor and a second main electrode of the fourth transistor being coupled to a second main electrode of the second transistor, a buffer stage comprising at least a fifth transistor of the first conductivity type, a control electrode of the fifth transistor being coupled to the second main electrode of the second transistor, a first main electrode of the fifth transistor being coupled to the output terminal and a second main electrode of the fifth transistor being coupled to the second supply terminal, and means coupling the control electrode of the first transistor to the common terminal by means of a first level shifting circuit.

2. An amplifier arrangement as claimed in claim 1, the control electrode of the fifth transistor is coupled to the second main electrode of the second transistor by means of a second level shifting circuit.

3. An amplifier arrangement as claimed in claim 1, wherein the first level shifting circuit comprises a further transistor of the second conductivity type and a second current source, a first main electrode of the further transistor being coupled to the second supply terminal by means of the second current source and to the common terminal, a second main electrode of the further transistor being coupled to the first supply terminal and a control electrode of the further transistor being coupled to the control electrode of the first transistor.

4. An amplifier arrangement as claimed in claim 2, wherein the second level shifting circuit comprises a further transistor of the second conductivity type and a second current source, a first main electrode of the further transistor being coupled to the second supply terminal by means of the second current source and to the control electrode of the fifth transistor, a second main electrode of the further transistor being coupled to the first supply terminal and a control electrode of the further transistor being coupled to the second main electrode of the second transistor.

5. An amplifier arrangement as claimed in claim 4, wherein the first current source and the second current source produce substantially equal currents.

6. An amplifier arrangement as claimed in claim 2, wherein the second main electrode of the fourth transistor is coupled to the second main electrode of the second transistor via a sixth transistor of the second conductivity type, and wherein the first level shifting circuit includes a semiconductor diode device serially coupled between the control electrode of the first transistor and said common terminal.

7. An amplifier arrangement as claimed in claim 1, further comprising a second current source coupling the common terminal to the second supply terminal.

8. An amplifier with a linear signal transmission characteristic between an amplifier input terminal and an amplifier output terminal comprising:

a differential amplifier including first and second transistors coupled to a first supply terminal via a current source, a current mirror having an input terminal coupled to one main electrode of the first transistor, an output terminal coupled to one main electrode of the second transistor, and a common terminal coupled to a second supply terminal, a further transistor coupled between the second supply terminal and the output terminal and having a control electrode coupled to said one main electrode of the second transistor, means coupling respective control electrodes of the first and second transistors to said input terminal and to said output terminal, and a level shift circuit coupled between said control electrode of the first transistor and said common terminal of the current mirror.

9. An amplifier as claimed in claim 8, wherein the current mirror comprises third and fourth transistors and the level shift circuit comprises a fifth transistor connected so that first and second oppositely polarized serially connected semiconductor junctions are coupled between the control electrode and the one main electrode of the first transistor.

10. An amplifier as claimed in claim 8, wherein the level shift circuit includes a second further transistor having its control electrode coupled to the input terminal so that, as seen from the input terminal, oppositely directed currents flow via the control electrodes of the first transistor and the second further transistor thereby to increase the input impedance at said input terminal.

11. An amplifier as claimed in claim 8, wherein the control electrode of the further transistor is coupled to said one main electrode of the second transistor via a second level shift circuit.

12. An amplifier as claimed in claim 11, wherein the second level shift circuit includes a third transistor coupled to the second supply terminal via a second current source such that the second level shift circuit supplies a compensation current to the second transistor so as to reduce any offset voltage present.

* * * * *